(12) United States Patent
Brun et al.

(10) Patent No.: US 8,723,312 B2
(45) Date of Patent: May 13, 2014

(54) ASSEMBLY OF A WIRE ELEMENT WITH A MICROELECTRONIC CHIP WITH A GROOVE COMPRISING AT LEAST ONE BUMP SECURING THE WIRE ELEMENT

(75) Inventors: Jean Brun, Champagnier (FR); Dominique Vicard, Saint Nazaire les Eymes (FR); Sophie Verrun, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 165 days.

(21) Appl. No.: 12/919,512

(22) PCT Filed: Oct. 21, 2008

(86) PCT No.: PCT/FR2008/001476
§ 371 (c)(1),
(2), (4) Date: Aug. 26, 2010

(87) PCT Pub. No.: WO2009/112644
PCT Pub. Date: Sep. 17, 2009

(65) Prior Publication Data
US 2011/0001237 A1    Jan. 6, 2011

(30) Foreign Application Priority Data
Mar. 6, 2008    (FR) ...................................... 08 01234

(51) Int. Cl.
*H01L 23/48*   (2006.01)
*H01L 23/52*   (2006.01)
*H01L 29/40*   (2006.01)
*H01L 23/02*   (2006.01)

(52) U.S. Cl.
USPC .......... 257/737; 257/686; 257/777; 257/780; 257/E23.068

(58) Field of Classification Search
USPC ................. 257/737, 738, 779, 780, E23.021, 257/E23.033, E23.068, E23.069, 686, 777
See application file for complete search history.

(56) References Cited

U.S. PATENT DOCUMENTS

| 5,956,575 A * | 9/1999 | Bertin et al. ................... 438/110 |
| 6,191,489 B1 * | 2/2001 | Igel et al. ...................... 257/778 |

(Continued)

FOREIGN PATENT DOCUMENTS

| JP | A-2006-257422 | 9/2006 |
| WO | WO 2004/098953 A2 | 11/2004 |
| WO | WO 2008/025889 A1 | 3/2008 |

OTHER PUBLICATIONS

International Search Report issued in Application No. PCT/FR2008/001476; Dated Jun. 29, 2009 (With Translation).

*Primary Examiner* — Teresa M Arroyo
(74) *Attorney, Agent, or Firm* — Oliff PLC

(57) ABSTRACT

The assembly comprises at least one microelectronic chip having two parallel main surfaces and lateral surfaces, at least one of the lateral faces comprising a longitudinal groove housing a wire element having an axis parallel to the longitudinal axis of the groove. The groove is delineated by at least two side walls. The wire element is secured to the chip at the level of a clamping area between at least one bump arranged on one of the side walls, and the side wall of the groove opposite said bump. The clamping area has a smaller height than the diameter of the wire element and a free area is arranged laterally to the bump along the longitudinal axis of the groove. The free area has a height, corresponding to the distance separating the two side walls, that is greater than the diameter of the wire element.

24 Claims, 4 Drawing Sheets

(56) References Cited

U.S. PATENT DOCUMENTS

| | | | |
|---|---|---|---|
| 6,504,105 B1* | 1/2003 | Acocella et al. | 174/255 |
| 6,932,136 B1 | 8/2005 | Kelkar et al. | |
| 2002/0027277 A1* | 3/2002 | Jackson | 257/690 |
| 2002/0066584 A1* | 6/2002 | Kurita | 174/52.1 |
| 2003/0214036 A1* | 11/2003 | Sarihan et al. | 257/738 |
| 2005/0006762 A1* | 1/2005 | Saimen | 257/734 |
| 2005/0006763 A1* | 1/2005 | Saimen | 257/734 |
| 2005/0104225 A1* | 5/2005 | Huang | 257/779 |
| 2006/0177965 A1* | 8/2006 | Senda | 438/108 |
| 2007/0262463 A1* | 11/2007 | Akram | 257/774 |
| 2009/0200066 A1* | 8/2009 | Vicard et al. | 174/255 |
| 2009/0227069 A1* | 9/2009 | Brun et al. | 438/113 |
| 2011/0198735 A1* | 8/2011 | Brun et al. | 257/622 |
| 2011/0287606 A1* | 11/2011 | Brun et al. | 438/460 |
| 2012/0064671 A1* | 3/2012 | Brun et al. | 438/118 |

* cited by examiner

ASSEMBLY OF A WIRE ELEMENT WITH A MICROELECTRONIC CHIP WITH A GROOVE COMPRISING AT LEAST ONE BUMP SECURING THE WIRE ELEMENT

BACKGROUND OF THE INVENTION

The invention relates to an assembly comprising at least one microelectronic chip provided with two parallel main surfaces and with lateral surfaces, at least one of the lateral surfaces comprising a longitudinal groove for housing a wire element having an axis parallel to the longitudinal axis of the groove, said groove being delineated by at least two side walls.

STATE OF THE ART

Numerous techniques for mechanically and electrically connecting microelectronic chips to one another exist at the present time. The conventional technique consists in making a rigid mechanical connection between the chips, once the chips have been formed on a substrate and released by dicing. The chips, fixed onto a rigid support, are then electrically connected before a protective coating is formed. This first approach, consisting in making a connection on a rigid support, is conventionally used when a great complexity in connection of the chips exists. However, this approach has the major drawback of using a rigid mechanical support, which is particularly unsuitable for integration in flexible structures.

The document WO2008/025889 filed by the applicant describes a microelectronic chip comprising two parallel main surfaces 1, 2 and lateral surfaces 3a, 3b, as illustrated in FIG. 1. At least one of lateral surfaces 3a, 3b comprises a groove 4 provided with an electrical connection element and forming a housing for a wire element 5 having an axis parallel to the longitudinal axis of groove 4. The electrical connection element is achieved by metallization of groove 4. Wire element 5, the axis whereof is parallel to the longitudinal axis of groove 4, can be secured to groove 4 by soldering with addition of material, by electrolysis, by adhesion, or by embedding. Embedding in groove 4 requires a force to be applied on wire element 5 that may damage or weaken the latter. Furthermore, depending on the length of groove 4, the forces to be applied when embedding is performed increase, thus making it difficult to perform embedding without damaging the chip. The strength by embedding remains weak and in general requires a strengthening phase involving the addition of a glue or a metal.

OBJECT OF THE INVENTION

The object of the invention is to produce a chip having a groove designed to accommodate a wire element by embedding, limiting the forces exerted on the wire when the latter is inserted in the groove.

This object is achieved by the fact that said wire element is secured to the chip at the level of a clamping area between at least one bump arranged on one of the side walls and the side wall of the groove opposite said bump, said clamping area having a height that is smaller than the diameter of the wire element, and that a free area is arranged laterally to the bump along the longitudinal axis of the groove, said free area having a height, corresponding to the distance separating the two side walls, that is greater than the diameter of the wire element.

According to a development, at least one of the bumps is an electrically conducting bump.

According to a second development, the two side walls support bumps arranged in zigzag manner.

According to a third development, the bumps are in the form of bars and can have an apex having a triangular cross-section.

According to an alternative embodiment, the diameter of the wire element is greater than the distance separating the bump from the bottom of the groove and the wire element is also in contact with the bottom of the groove.

According to an improvement, the wire element comprises an electrically conducting core covered by an insulator, the sum of the diameter of the core and of the thickness of the insulator being greater than the height of the clamping area.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

Figure 1:
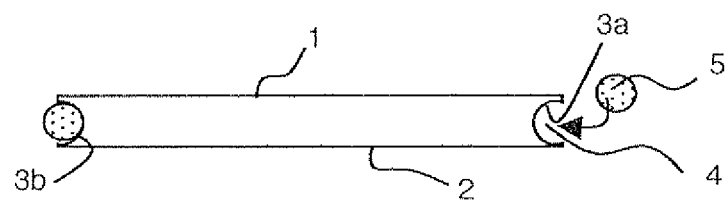
FIG. 1 represents a chip according to the prior art.
Figure 2:
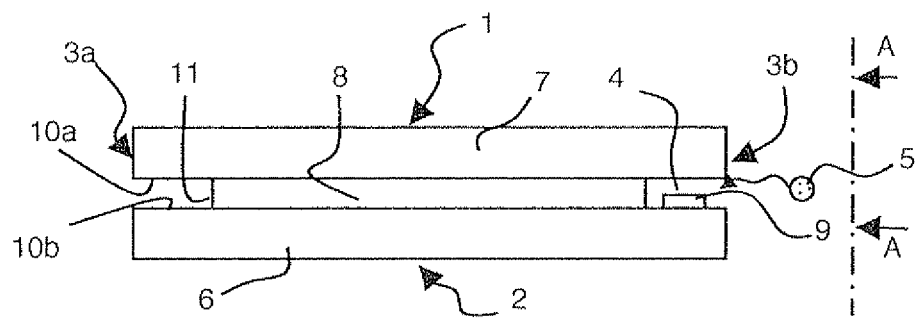
FIG. 2 represents a chip according to the invention.

As illustrated in FIG. 2, a microelectronic chip according to the invention comprises two parallel main surfaces 1, 2 and lateral surfaces 3a and 3b. At least one of lateral surfaces 3a, 3b comprises a longitudinal groove 4. Groove 4 is delineated by two side walls 10a and 10b and a bottom 11. The groove is designed to accommodate a wire element having a longitudinal axis that is parallel to the longitudinal axis of the groove.

This type of chip can be in the form of an assembly of two microelectronic components or of a microelectronic component 6 and a counter-plate 7, of substantially the same dimensions and joined to one another by a spacer 8. The spacer being of smaller dimensions than those of the component, placement thereof enables at least one groove 4 to be obtained naturally. As illustrated in FIG. 2, the chip can comprise two grooves 4 arranged on each side of spacer 8. Grooves 4 are thus obtained by assembly of the chip, avoiding a complex machining step that is liable to damage the chip when the latter is fabricated. Each groove is U-shaped and is delineated by the two substantially parallel side walls 10a and 10b joined to one another by bottom 11 of groove 4. Counter-plate 7 can be made from glass, composite material, and so on.

Figure 3:
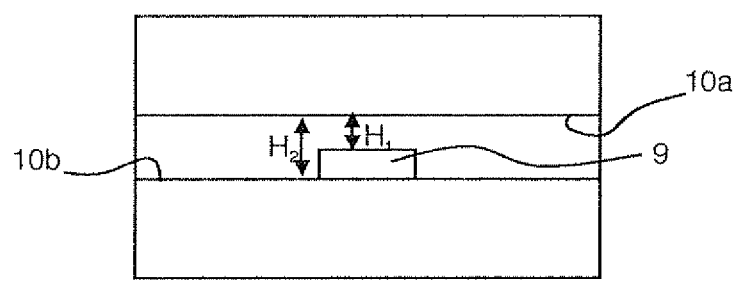
FIG. 3 represents a view along the line A-A of FIG. 2.

Each groove 4 respectively enables a wire element 5 to be inserted by embedding along a longitudinal axis parallel to the longitudinal axis of groove 4. Groove 4 comprises means for securing wire element 5 enabling wire element 5 to be secured in groove 4. These means for securing consist of at least one bump 9 arranged on at least one of side walls 10a, 10b of groove 4. Wire element 5 can thereby be secured to the chip at the level of a clamping area between at least one bump 9 and side wall 10b or 10a located opposite bump 9 (10a in FIG. 9). As illustrated in FIG. 3, the clamping area has a height $H_1$, this height having to be smaller than the diameter of the wire element that is to be used to perform assembly. Height $H_1$ of the clamping area can be defined by the perpendicular with respect to the apex of bump 9 up to the interface with opposite side wall 10a. A free area is further arranged laterally to bump 9 along the longitudinal axis of the groove. The free area has a height $H_2$ which corresponds to the distance separating the two side walls 10a and 10b, and this height is greater than the diameter of wire element 5. The free area can surround each bump 9 and, in the case where the groove comprises a plurality of bumps, the bumps are separated by a free area. Contact at the level of the clamping area is thereby pin-point and embedding of wire element 5 in groove 4 does not require too great a force. As the force to be applied corresponds in fact to the friction forces, the pin-point contact exerted by each bump 9 makes a simple and high-quality embedding of wire element 5.

Figure 4:
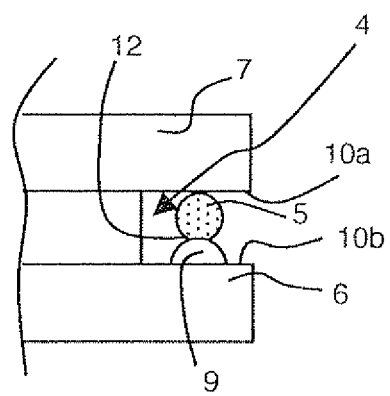
FIGS. 4 to 6 schematically represent views centred on the groove of a chip.

Each bump 9 comprises a base in contact with one of side walls 10a or 10b whereon it is arranged and an apex oriented in the direction of the opposite side wall 10a or 10b. Each bump 9 acts as a mechanical grip, in cooperation with opposite side wall 10a or 10b, when a wire element 5 is embedded in groove 4. As illustrated in FIG. 4, when wire element 5 is inserted in groove 4, wire element 5 is crushed by a pin-point contact between bump 9, arranged on wall 10b of groove 4, and wall 10a of the groove opposite bump 9. Jamming of wire element 5 by single clamping (between a bump and the side wall opposite the bump) allows that the latter is held in groove 4.

In addition to its role of securing wire element 5, a bump 9 can be active, i.e. it corresponds to a connection terminal of microelectronic component 6. Bump 9 is electrically conducting and can act as data or power supply bus. To improve securing, the groove can comprise a plurality of bumps 9, at least one whereof preferably being active.

The pressure exerted by bump 9 on wire element 5 fosters intimate contact between wire element 5 and bump 9. Thus, when bump 9 and wire element 5 are electrically conductive, the large pressure at the level of contact area 12 enables intimate contact to be obtained by scratching the materials at the level of contact area 12. This contact is necessary for a good electric conduction between bump 9 and wire element 5.

Figure 5:
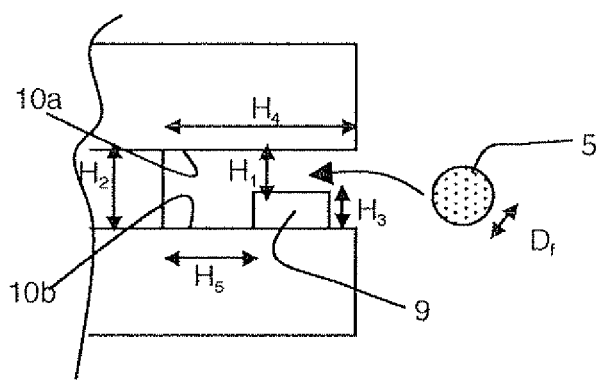

In order to achieve sufficient securing of wire element 5, groove 4 and bump(s) 9 have to be dimensioned according to the diameter of wire element 5 intended to be embedded therein. The size of the sides of bumps 9 is in general from 50 to 200 µm and their height $H_3$ can vary between 2 and 100 µm. Thus, as illustrated in FIG. 5, a bump 9 of height $H_3$ is arranged on a wall 10b (bottom wall of FIG. 5) of groove 4. Groove 4 has a depth $H_4$ and its width corresponds to height $H_2$ of the free area, i.e. to the distance separating side walls 10a, 10b. To be secured by single clamping, diameter $D_f$ of the wire element, before embedding, has to be larger than the distance $H_1=H_2-H_3$ separating the apex of bump 9 from side wall 10a (top wall in FIG. 5) opposite bump 9, i.e. $D_f > H_1$. The distance $H_1$ separating bump 9 from opposite side wall 10a is preferably comprised between 98% and 80% of the diameter of wire element 5. This distance $H_1$ therefore depends on diameter $D_f$ of wire element 5 and on the materials that form the latter.

A bump 9 is preferably made from a material that is more malleable than wire element 5 or vice-versa. This characteristic enhances intimate contact between bump 9 and wire element 5 in the case of an electrically conducting connection. For example purposes, bumps can be made from nickel, copper or gold and a wire element from copper or a silver and tungsten alloy. The more malleable the material from which wire element 5 is made compared with the material forming bump 9, the smaller distance $H_1$ will be compared with diameter $D_f$ on account of the fact that the wire element will be very easily deformable.

Figure 6:
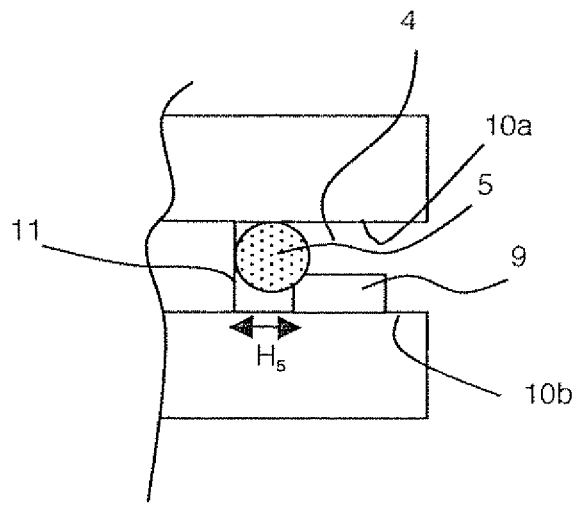

Securing of wire element 5 can also be achieved by multiple clamping. The term multiple clamping applies when wire element 5 passes over bump 9 when the latter is inserted as illustrated in FIG. 6. Wire element 5 is then blocked by both bump 9, bottom 11 of groove 4 and side wall 10a opposite bump 9. Such a securing involves additional stresses. Thus, as illustrated by FIGS. 5 and 6, height $H_1$ separating the apex of bump 9 and wall 10a opposite the bump always has to be smaller than diameter $D_f$ of wire element 5. Distance $H_5$ separating bottom 11 of the groove from bump 9 is smaller than the diameter of wire element 5. Indeed, if distance $H_5$ was greater than the diameter of wire element 5, the latter once inserted would not be secured to the chip, thereby enabling the chip to slide freely along wire element 5, and it would no longer be possible to say that wire element 5 was clamped.

Each bump 9 is preferably narrow in comparison with the length of groove 4 in which it is located. Indeed, the narrower the bump, the smaller contact area 12 of bump 9 with a wire element 5 will be. It is thus easier to insert wire element 5 and to achieve blocking of the latter in groove 4 without damaging the latter by limiting the forces to be exerted for insertion.

The electrically conducting wire element can be enameled in which case the pressure exerted to insert the latter enables the enamel to be scratched up to the electrically conducting core of wire element 5 at the level of the contact area with bump 9. According to an alternative embodiment, the wire element is coated with an organic insulating deposit (thermoplastic, epoxy, etc.) and/or mineral insulating deposit ($SiO_2$, alumina, etc.). This deposit will be pierced when wire element 5 is stressed against bump 9. Wire element 5 is then individually in electric contact with a bump 9 and is insulated outside contact area 12. In the case of a thermoplastic deposit, the latter can also be remelted to ensure adhesion of the wire in the groove. The thickness of the insulator covering the electrically conducting wires is typically about 2 to 50 µm. In the case where the wire element is covered by an insulator, the diameter of the electrically conducting core, plus the thickness of the insulating layer, has to be greater than height $H_1$ of the clamping area.

The number of bumps 9 in contact with wire element 5 can be increased. By increasing the number of bumps 9, the friction force ensuring securing of wire element 5 in groove 4 becomes greater. Groove 4 of the chip can thus comprise a plurality of bumps 9 arranged on side wall 10b of groove 4. Preferably at least one of these bumps 9 is electrically conducting to supply power to the chip or to act as data bus. The other non electrically conducting bumps then only serve the purpose of securing means of wire element 5.

Figure 7:
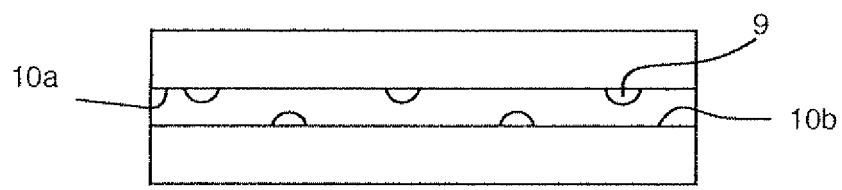
FIGS. 7 to 10 represent alternative embodiments of the arrangement and shape of the bumps in the groove.

According to an alternative embodiment illustrated in FIG. 7, securing of wire element 5 in groove 4 is performed by bumps 9 placed on the two side walls 10a and 10b of groove 4. Bumps 9 are preferably located in zigzag manner and at regular intervals. Placing the bumps in zigzag manner improves the blocking function of bumps 9, by single or multiple clamping. Furthermore, in the case where the chip is made with two microelectronic components separated by a spacer, each side wall of each groove 4 can comprise at least one electrically conducting bump 9 to perform the power supply and/or data bus functions.

Figure 8:
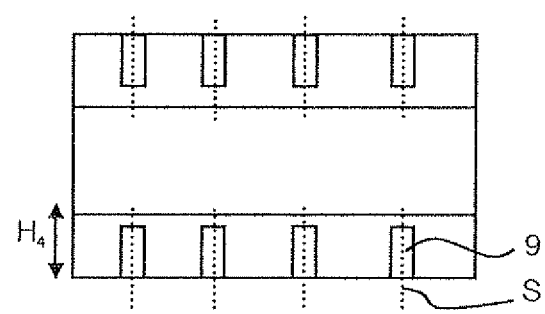

The shape of bumps 9 can have an influence on securing of the wire element in the groove. The bumps can be in the form of a cube (FIGS. 2, 3, 5 and 6), of half-balls (FIGS. 4 and 7) or, as illustrated in FIG. 8, they can be in the form of bars extending perpendicularly to bottom 11 of groove 4 along an axis of symmetry S. The bars preferably have a length that is lower than or equal to the depth $H_4$ of groove 4. To enable securing to be achieved by single clamping of wire element 5, the bars can extend over the whole length corresponding to depth $H_4$ of the groove. To enable multiple clamping, the bars have to be of lower length than depth $H_4$ of groove 4 and have to be arranged in such a way as to leave an empty space, smaller than the diameter of wire element 5, between each bar and bottom 11 of the groove.

Figure 9:
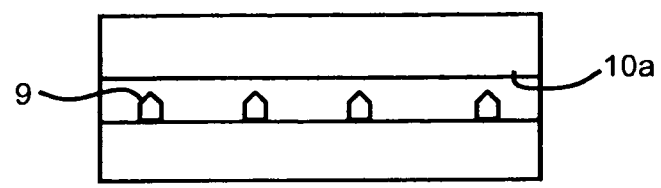

According to a development illustrated in FIG. 9, the apex of the bars forming bumps 9, facing in the direction of opposite side wall 10a, can be in the form of a tip, i.e. the apex comprises a triangular cross-section. With an apex of triangular cross-section, when insertion in force takes place, the material forming wire element 5 will deform more easily, and if applicable will be bared more easily, which will enable a better electric contact to be obtained by improving the intimate contact between the apex in the form of a tip of the bar and the material or materials forming wire element 5.

Figure 10:
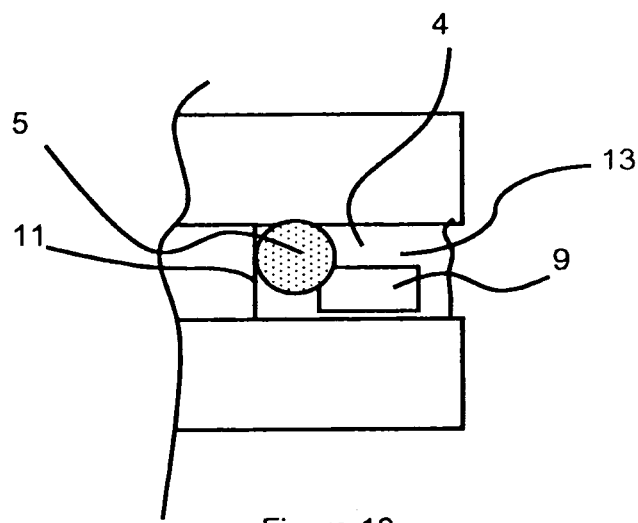

Once secured in groove 4, the connection between wire element 5 and groove 4 can be improved by different methods such as electrolysis or adhesion by means of an insulating or conducting glue 13, as illustrated in FIG. 10.

Securing of the wire element as described enables chips to be connected to one another electrically and/or mechanically in the form of a daisy chain or two by two. Any type of assembly (parallel, serial, etc.) of the chips can thus be imagined.

The bumps are preferably made from electrolytic nickel coated with a gold deposit of 1000 to 3000 Å.

The assembly can comprise a plurality of chips connected in the form of a daisy chain sharing the same data bus.

The invention claimed is:

1. Assembly comprising:
a microelectronic chip with a main face;
a plate integral to the microelectronic chip, the plate having a main face;
a spacer joining the main face of the microelectronic chip and the main face of the plate, and configured to define a groove by means of the main face of the microelectronic chip, the main face of the plate and a side wall of the spacer, the groove being parallel to the main face of the microelectronic chip, and configured to embed a wire element along a longitudinal axis parallel to a longitudinal axis of the groove, the wire element being longer in its longitudinal axis than in a radial axis; and
a bump arranged protruding from one of the main faces and defining a first area devoid of any bump wherein the two main faces are separated by a larger distance than a diameter of the wire element, and a second area wherein a face of the bump and the other of the main faces are separated by a smaller distance than the diameter of the wire element, the bump being configured to secure the wire element to the microelectronic chip by clamping between the bump and the other of the main faces.

2. Assembly according to claim 1, wherein the first area and the second area are laterally staggered along the longitudinal axis of the wire element.

3. Assembly according to claim 1, wherein the bump is made of electrically conductive material and electrically coupled to the microelectronic chip.

4. Assembly according to claim 1, wherein a plurality of bumps are protruding from the two main faces and are arranged staggered along the longitudinal axis of the groove so as to form a zigzag arrangement of the wire element in the groove.

5. Assembly according to claim 1, wherein each bump has an apex of a triangular section.

6. Assembly according to claim 1, wherein the wire element comprises an electrically conducting core covered with an insulator, the sum of a diameter of the core and a thickness of the insulator being greater than the distance separating the face of the bump and the other of the main faces.

7. Assembly according to claim 1, comprising an electrically insulating glue arranged between the wire element and the groove.

8. Assembly according to claim 1, comprising an electrically conductive glue arranged between the wire element and the groove.

9. Assembly comprising:
a microelectronic chip with a main face;
a plate integral to the microelectronic chip, the plate having a main face;
a spacer separating the microelectronic chip and the plate, and configured to define a groove by means of the main face of the microelectronic chip, the main face of the plate and a sidewall of the spacer, the groove being configured for housing a wire element having an axis parallel to a longitudinal axis of the groove; and
a bump arranged protruding from one of the main faces and defining a first area devoid of any bump wherein the two main faces are separated by a larger distance than a diameter of the wire element and a second area wherein a face of the bump and the other of the main faces are separated by a smaller distance than the diameter of the wire element, the bump being configured to secure the wire element to the chip by clamping between the bump and the other of the main faces, the distance separating the face of the bump and the other of the main faces being between 80% and 98% of the diameter of the wire element.

10. Assembly according to claim 9, wherein the first area and the second area are laterally staggered along the longitudinal axis of the wire element.

11. Assembly according to claim 9, wherein the bump is made of electrically conductive material and electrically coupled to the microelectronic chip.

12. Assembly according to claim 9, wherein a plurality of bumps are protruding from the two main faces and are arranged staggered along the longitudinal axis of the groove so as to form a zigzag arrangement of the wire element in the groove.

13. Assembly according to claim 9, wherein each bump has an apex of a triangular section.

14. Assembly according to claim 9, wherein the wire element comprises an electrically conducting core with an insulator, the sum of the diameter of the core and a thickness of the insulator being greater than the distance separating the face of the bump and the other of the main faces.

15. Assembly according to claim 9, further comprising an electrically insulating glue arranged between the wire element and the groove.

16. Assembly according to claim 9, further comprising an electrically conductive glue arranged between the wire element and the groove.

17. Assembly comprising:
a microelectronic chip with a main face;
a plate integral to the microelectronic chip, the plate having a main face;
a spacer joining the microelectronic chip and the plate, and configured to define a groove by means of the main face of the microelectronic chip, the main face of the plate and a side wall of the spacer, the groove being configured to house a wire element having an axis parallel to a longitudinal axis of the groove; and a bump arranged protruding from one of the main faces and defining a first area devoid of any bump wherein the two main faces are separated by a larger distance than a diameter of the wire element, and a second area wherein a face of the bump and the other of the main faces are separated by a smaller distance than the diameter of the wire element, and the diameter of the wire element being greater than a distance separating the bump from the side wall of the spacer such that the wire element is in contact with the side wall of the spacer, the bump being configured to secure the wire element to the microelectronic chip by clamping between the bump and the other of the main faces.

18. Assembly according to claim 17, wherein the first area and the second area are laterally staggered along the longitudinal axis of the wire element.

19. Assembly according to claim 17, wherein the bump is made of electrically conductive material and electrically coupled to the microelectronic chip.

20. Assembly according to claim 17, wherein a plurality of bumps are protruding from the two main faces and are arranged staggered along the longitudinal axis of the groove so as to form a zigzag arrangement of the wire element in the groove.

21. Assembly according to claim 17, wherein each bump has an apex of a triangular section.

22. Assembly according to claim 17, wherein the wire element comprises an electrically conducting core with an insulator, the sum of the diameter of the core and a thickness of the insulator being greater than the distance separating the face of the bump and the other of the main faces.

23. Assembly according to claim 17, further comprising an electrically insulating glue arranged between the wire element and the groove.

24. Assembly according to claim 17, further comprising an electrically conductive glue arranged between the wire element and the groove.

* * * * *